United States Patent
Hoshizaki et al.

[11] Patent Number: 5,258,948
[45] Date of Patent: Nov. 2, 1993

[54] MEMORY CELL SENSE TECHNIQUE

[75] Inventors: Gary W. Hoshizaki, Mesa; Robert N. Dotson, Chandler, both of Ariz.

[73] Assignee: Motorola, Inc., Schaumburg, Ill.

[21] Appl. No.: 829,659

[22] Filed: Feb. 3, 1992

[51] Int. Cl.$^5$ .............................................. G11C 11/00
[52] U.S. Cl. ................................... 365/154; 365/203
[58] Field of Search ............... 365/154, 156, 205, 207, 365/204, 203, 190; 307/264, 530, 473

[56] References Cited

U.S. PATENT DOCUMENTS

| | | | |
|---|---|---|---|
| 4,123,799 | 10/1978 | Peterson | 307/530 |
| 4,326,269 | 4/1982 | Ludington | 365/207 |
| 4,542,483 | 9/1985 | Procyk | 365/190 |
| 4,991,141 | 2/1991 | Tran | 365/207 |
| 5,034,923 | 7/1991 | Kuo | 365/154 |
| 5,068,830 | 11/1991 | Plants | 365/190 |

Primary Examiner—Eugene R. LaRoche
Assistant Examiner—A. Zarabian
Attorney, Agent, or Firm—Joe E. Barbee

[57] ABSTRACT

A memory cell sense technique for sensing a logic state of a memory cell. An output level translator (33) which can be preset to a predetermined logic state is utilized. A current source circuit (24) and a current sink circuit (26) change memory cell sensing into two distinct modes. In the first mode, the memory cell logic state is identical to the preset output logic state. The memory cell generates a differential voltage which is countered by a differential voltage created by the current source and current sink circuit. Inputs to a sensing circuit common mode and non-complemented output (44) remains in the preset logic state. In the second mode, the current source circuit and current sink circuit aid the memory cell in generating a differential voltage. The sensing circuit senses the differential voltage and changes the non-complemented output (44) from the preset logic state.

20 Claims, 1 Drawing Sheet

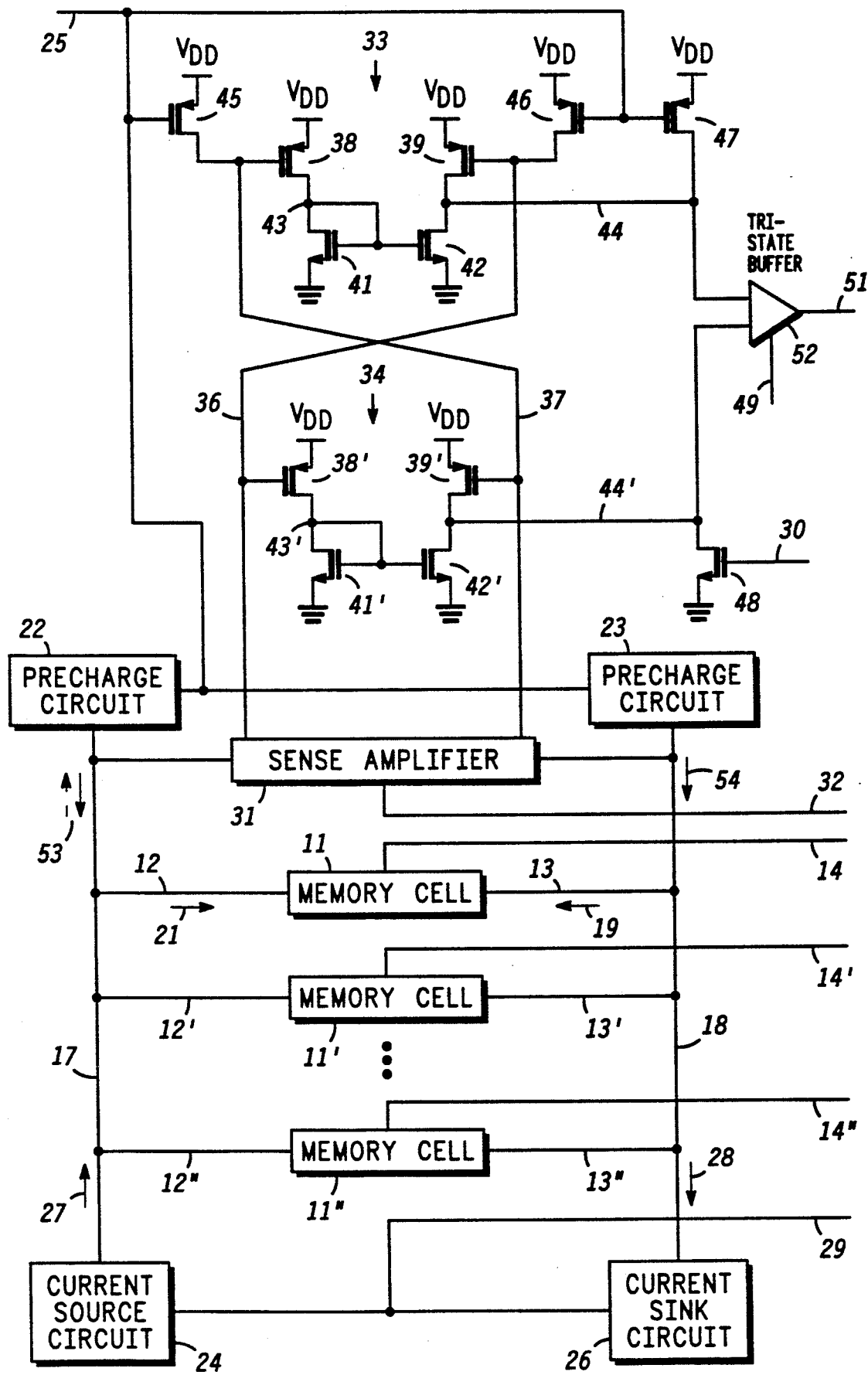

MEMORY CELL SENSE TECHNIQUE

BACKGROUND OF THE INVENTION

This invention relates, in general, to memory cell sensing, and more particularly to increasing the speed at which the memory cell logic state can be transferred to the output of a static random access memory (SRAM).

Semiconductor manufacturers are continually increasing the number of memory cells which can be built into an SRAM. The increase in memory density is due mainly to shrinking semiconductor device sizes through advances in semiconductor process technology. Users of SRAMs want memory densities and memory performance to increase simultaneously. From a design perspective, adding memory cells to an SRAM will decrease memory performance by adding parasitic capacitance to the memory array and slowing circuits which drive the larger capacitive load.

Large memory array sizes have a severe impact on memory cell sensing. Reducing the size of a memory cell, is mainly accomplished with smaller transistor sizes in the memory cell. Although the smaller memory cell will have a smaller parasitic capacitance, the increased number of memory cells and the reduced drive strength of the smaller transistors (in the memory cell) have a net effect of slowing memory cell sensing.

To counter the increased capacitance of larger memory arrays, block architected SRAMs are built to break the large memory array into smaller arrays which can be individually or simultaneously accessed. The tradeoff of building a block architected SRAM is the addition of block decode circuitry and the extra silicon area needed to implement the additional decode scheme. Almost all high density SRAMs use a block architecture to enhance memory performance.

A memory block comprises a number of memory cell rows and columns. An individual memory cell logic state is sensed from a memory cell column. The memory cell to be sensed is the only cell activated in the memory cell column. Each memory cell column has a first bit line and a second bit line to which all memory cells in the column are coupled. The first bit and second bit lines are charged to a predetermined voltage. The enabled memory cell creates a differential voltage across the first bit line and second bit line signifying the memory cell logic state.

A sense amplifier is coupled to the first bit line and the second bit line. The sense amplifier amplifies the differential voltage created by the memory cell. The amplified differential signal is coupled to an output level translator circuit. The output level translator converts the differential signal into a binary logic state corresponding to the memory cell logic state. The output level translator may couple to a buffer or tri-state buffer to drive a capacitive load.

As memory arrays continue to increase in size, it will be important to provide new techniques which improve performance in memory cell sensing, thereby allowing higher density SRAMs to also operate at faster speeds.

SUMMARY OF THE INVENTION

This invention involves a memory cell sense technique for reducing the time needed to sense a memory cell logic state. Three key elements of the method are an output level translator stage which has an output preset to a memory cell second logic state prior to a memory cell sense cycle, a current source circuit for sourcing current to a first bit line during a memory cell sense cycle, and a current sink circuit for sinking current to a second bit line during a memory cell sense cycle. The current source circuit and current sink circuit are enabled or disabled by a current control signal.

The first bit line and the second bit line are precharged to an identical predetermined voltage prior to a memory cell sense cycle. The predetermined voltage allows positive and negative voltage swings during a memory cell sense cycle on the first bit line or the second bit line.

BRIEF DESCRIPTION OF THE DRAWINGS

The single FIGURE is an illustration of a memory cell sense circuit in accordance with the present invention.

DETAILED DESCRIPTION OF THE DRAWINGS

The single FIGURE illustrates a preferred embodiment of a memory cell sense circuit. A plurality of memory cells 11, 11', and 11" form a column of memory cells. The memory cells 11, 11', and 11" each has a corresponding first input 12, 12', and 12", a corresponding second input 13, 13', and 13", and each receives a corresponding memory cell control signal 14, 14', and 14".

Memory cells 11, 11', and 11" are built identically and store two different logic states. The memory cell logic states will be referred to as a memory cell first logic state and a memory cell second logic state. In the preferred embodiment, each memory cell 11, 11', and 11" can sink a current I but cannot source any appreciable current. If memory cell 11 is in a memory cell first logic state, memory cell 11 second output 13 will sink a current I as indicated by an arrow 19, first output 12 will not sink or source current. If memory cell 11 is in a memory cell second logic state, memory cell 11 first output 12 will sink a current I as indicated by an arrow 21 and second output 13 will not sink or source current.

Memory cells 11, 11', and 11" are modeled after a common memory cell used in high density SRAMs known as a four transistor memory cell. Two extremely high resistance resistors are used in the memory cell to form a latch with two of the transistors. An article describing this common memory cell is in the Sep. 27, 1979 issue of Electronics.

A precharge circuit 22 and a precharge circuit 23 serves as a means for precharging. Precharge circuit 22 charges a first bit line 17 to a predetermined voltage prior to starting a memory cell sense cycle. Precharge circuit 23 charges a second bit line 18 to a predetermined voltage prior to starting a memory cell sense cycle. In the preferred embodiment, precharge circuits 22 and 23 are enabled and disabled by an intialization signal 25, and precharge bit lines 17 and 18 to identical predetermined voltages. The predetermined voltage allows positive and negative voltage transitions on first bit line 17 or second bit line 18 during a memory cell sense cycle.

Each memory cell first output 12, 12', and 12" couples to first bit line 17. Each memory cell second output 13, 13', and 13" couples to second bit line 18. A single memory cell in the column of memory cells is enabled during a memory cell sense cycle. The enabled single memory cell will either sink a current I from first bit line 17 or second bit line 18 (depending on the logic state stored in the memory cell).

A current source circuit 24 serves as a means for sourcing current to first bit line 17. Current source circuit 24 sources a current I/2 to first bit line 17 during a memory cell sense cycle as indicated by arrow 27. A current sink circuit 26 serves as a means for sinking current to second bit line 18. Current sink circuit 26 can sink a current $-I/2$ from second bit line 18 during a memory cell sense cycle as indicated by an arrow 28. Both current source circuit 24 and current sink circuit 26 are enabled by a current control signal 29.

In the preferred embodiment, it is essential for current source circuit 24 and current sink circuit 26 to generate an accurate ratio of the current sink magnitude of a memory cell and to track this ratio over varying process, voltage, and temperature conditions. A simple way to achieve a ratioed current is to mimic a memory cell and ratio transistor geometries to get a desired current. A current mirror circuit is used to generate a source current from the ratioed sink current.

A sense amplifier 31 amplifies any voltage difference between first bit line 17 and second bit line 18. Sense amplifier 31 couples to first bit line 17, second bit line 18, receives sense control signal 32, has a first output coupled to a line 36 and has a second output coupled to a line 37. When enabled by sense control signal 32 and receiving a zero differential signal, sense amplifier 31 will stabilize such that the first output and the second output are at identical predetermined voltages. The predetermined voltage of the first and second output of sense amplifier 31 allow for positive and negative voltage swings on line 36 or line 37 when sense amplifier 31 receives a differential voltage.

An output level translator 33 and an output level translator 34 each serve as a means for converting a differential voltage to a binary logic state. Output level translator 33 generates a non-complemented binary logic state of a memory cell logic state. Output level translator 34 generates a complemented binary logic state of a memory cell logic state.

Output level translator 33 comprises p-channel enhancement MOSFET 38, p-channel enhancement MOSFET 39, n-channel enhancement MOSFET 41, and n-channel enhancement MOSFET 42. MOSFET 38 has a gate coupled to line 37, a source coupled to a voltage terminal Vdd, and a drain coupled to a node 43. MOSFET 39 has a gate coupled to line 36, a source coupled to voltage terminal Vdd, and a drain coupled to a non-complemented output 44. MOSFETs 38 and 39 form an input differential pair which receives an amplified differential signal from sense amplifier 31. MOSFET 41 has a gate coupled to node 43, a source coupled to ground, and a drain coupled to node 43. MOSFET 42 has a gate coupled to node 43, a source coupled to ground, and a drain coupled to non-complemented output 44. MOSFET 41 and MOSFET 42 form a current mirror. In the preferred embodiment, MOSFET 38 and MOSFET 39 have identical geometries, and MOSFET 41 and MOSFET 42 have identical geometries.

Output level translator 34 comprises p-channel enhancement MOSFET 38', p-channel enhancement MOSFET 39', n-channel enhancement MOSFET 41', and n-channel enhancement MOSFET 42'. MOSFET 38' has a gate coupled to line 36, a source coupled to voltage terminal Vdd, and a drain coupled to a node 43'. MOSFET 39' has a gate coupled to line 37, a source coupled to voltage terminal Vdd, and a drain coupled to a complemented output 44'. MOSFETs 38' and 39' form an input differential pair which receives an amplified differential signal from sense amplifier 31. MOSFET 41' has a gate coupled to node 43', a source coupled to ground, and a drain coupled to node 43'. MOSFET 42' has a gate coupled to node 43', a source coupled to ground, and a drain coupled to complemented output 44'. MOSFET 41' and MOSFET 42' form a current mirror. In the preferred embodiment, MOSFET 38' and MOSFET 39' have identical geometries, and MOSFET 41' and MOSFET 42' have identical geometries.

Prior to starting a memory cell sense cycle, sense amplifier 31 is disabled by sense control signal 32. Line 36 is precharged by a p-channel enhancement MOSFET 46. MOSFET 46 has a gate coupled to initialization signal 25, a source coupled to voltage terminal Vdd, and a drain coupled to line 36. Line 37 is precharged by a p-channel enhancement MOSFET 45. MOSFET 45 has a gate coupled to intialization signal 25, a source coupled to voltage terminal Vdd, and a drain coupled to line 37. Precharging lines 36 and 37, disables the input differential pair of output level translators 33 and 34, thereby allowing the non-complemented output 44 and complemented output 44' to be preset to a predetermined logic state. Non-complemented output 44 is preset by a p-channel MOSFET 47 to a one logic state signifying a memory cell second logic state. MOSFET 47 has a gate coupled to intialization signal 25, a source coupled to voltage terminal Vdd, and a drain coupled to non-complimented output 44. Complemented output 44' is preset by a n-channel MOSFET 48 to a zero logic state signifying a complemented memory cell second logic state. MOSFET 48 has a gate coupled to inverted initialization signal 30, a source coupled to ground, and a drain coupled to complemented output 44'.

A tri-state buffer 52 provides an output. Tri-state buffer 52 receives non-complemented output 44, complemented output 44', a buffer enable signal 49, and has a tri-state output 51. Buffer enable signal 49 enables tri-state buffer 52 to output a memory cell logic state during a memory cell sense cycle.

A memory cell sense cycle will be described for a memory cell in either logic state. Prior to starting the memory cell sense cycle the memory cell sense circuit is intialized. First bit line 17 and second bit line 18 are precharged to a predetermined voltage by precharge circuits 22 and 23. Sense amplifier 31, current source circuit 24, and current sink circuit 26 are disabled. MOSFET 45 and MOSFET 46 precharge lines 37 and 36 which disables output level translators 33 and 34. Non-complemented output 44 is preset to a one logic state and complemented output 44' is preset to a zero logic state. Tri-state buffer 52 is disabled by buffer enable signal 49.

A memory cell sense cycle starts by initialization signal 25 disabling precharge circuit 22, precharge circuit 23, MOSFET 45, MOSFET 46, and MOSFET 47. MOSFET 48 is disabled by inverted initialization signal 30. A single memory cell, for example, memory cell 11, in the column of memory cells is enabled. In the preferred embodiment, current control signal 29 is timed to enable current source circuit 24 and current sink circuit 26 simultaneously with the enabled memory cell. Sense amplifier 31 is also enabled. Sense amplifier 31 first and second outputs stabilize at the predetermined voltage before a differential voltage across first bit line 17 and second bit line 18 develops.

If memory cell 11 is in a first logic state, memory cell 11 will sink a current −I through second output 13 as indicated by arrow 19. Current sink circuit 26 sinks a current −I/2. Second bit line 18 is discharged by a net −3I/2 current (−I−I/2) as indicated by arrow 54. Memory cell 11 first output 12 does not sink or source any appreciable current in the first logic state. Current source circuit 24 sources I/2 current. First bit line 17 is charged by a net current I/2 (0+I/2) as indicated by broken arrow 53. A differential voltage across first and second bit lines 17 and 18 is created as first bit line 17 charges up and second bit line 18 is discharged. The differential voltage is created with a net current magnitude of 2I (I/2 first bit line 17 and −3I/2 second bit line 18) which is twice the current sink capability of a memory cell.

Sense amplifier 31 amplifies the differential voltage. Second output of sense amplifier 31 generates a negative voltage transition on line 37. First output of sense amplifier 31 generates a positive voltage transition on line 36.

Output level translator 33 generates a memory cell first logic state at non-complemented output 44. The positive voltage transition on line 36 decreases current output of MOSFET 39. The negative transition on line 37 increases current output of MOSFET 38. This increases current in MOSFET 41 and is mirrored as an increasing sink current by MOSFET 42. Decreasing source current from MOSFET 39 combines with increasing sink current from MOSFET 42 to generate a net sink current which discharges non-complemented output 44 to a zero logic state signifying a memory cell first logic state.

Output level translator 34 complemented output changes from the preset zero logic state. The negative voltage transition on line 37 increases current output of MOSFET 39'. The positive voltage transition on line 36 decreases current output of MOSFET 38'. This decreases current in MOSFET 41' and is mirrored as a decreasing sink current from MOSFET 42'. Increasing source current from MOSFET 39' combines with decreasing current sink current from MOSFET 42' to generate a net source current at complemented memory output 44'. The net source current changes the preset zero logic state to a one logic state signifying a complemented memory cell first logic state.

In the preferred embodiment, buffer enable signal 49 enables tri-state buffer 52 as non-complemented output 44 and complemented output 44' transition to their final logic state, thereby eliminating tri-state output 51 from generating a false output logic state. Upon enabling tri-state buffer 52, tri-state buffer output 51 will transition to a zero logic state signifying a memory cell first logic state. In this mode (a memory cell in a first logic state), current source circuit 24 and current sink circuit 26 combine with the enabled memory cell to increase the rate at which a differential voltage is created, thereby increasing memory cell sense speed.

If memory cell 11 is in a second logic state, memory cell 11 sinks a current −I through first output 12 as indicated by arrow 21. Current source circuit 24 sources a current I/2. First bit line 17 is discharged by a net −I/2 current (−I+I/2) as indicated by solid arrow 53. Memory cell 11 second output 13 does not sink or source current in the second logic state. Current sink circuit 26 sinks a current −I/2. Second bit line 18 is discharged by a net −I/2 current (0−I/2) as indicated by arrow 54. Note that both first bit line 17 and second bit line 18 are discharged by identical −I/2 currents. Because first bit line 17 and second bit line 18 are precharged to identical predetermined voltages prior to starting the memory cell sense cycle and both are discharged by identical −I/2 currents, no differential voltage is created across first bit line 17 and second bit line 18.

Sense amplifier 31 has no differential voltage to amplify. The first and second outputs of sense amplifier 31 remain at the identical predetermined voltages. Both output level translator 33 and output level translator 34 input differential pairs receive identical input voltages from line 36 and line 37.

Output level translator 33 input differential pair MOSFETs 38 and 39 source identical currents. Current mirror pair MOSFETs 41 and 42 generate a sink current identical to the source currents of MOSFETs 38 and 39. MOSFET 39 source current cancels MOSFET 42 sink current yielding no current to charge or discharge non-complement output 44. Non-complemented output 44 remains in the preset one logic state signifying a second memory cell logic state.

Output level translator 34 input differential pair MOSFETs 38' and 39' source identical currents. Current mirror pair MOSFETs 41' and 42' generate a sink current identical to the source currents of MOSFETs 38' and 39' MOSFET 39' source current cancels MOSFET 42' sink current yielding no current to charge or discharge complemented output 44'. Complemented output 44' remains in the preset zero logic state signifying a complemented second memory cell logic state.

Enabling tri-state buffer 52 with buffer enable signal 49 will cause tri-state buffer output 51 to transition to a one logic state signifying a memory cell second logic state. In this mode (a memory cell in a second logic state), current source circuit 24 and current sink circuit 26 combine with the enabled memory cell to generate identical discharging currents on first bit line 17 and second bit line 18, thereby yielding no differential voltage and allowing non-complemented output 44 and complemented output 44' to remain in their preset logic state signifying a memory cell second logic state.

In reality, MOSFET devices cannot be perfectly matched or have infinite output impedance. Utilizing MOSFET device manufacturing processes with MOSFET device matching techniques will minimize device differences but not eliminate them. For each manufacturing process, a worst case offset voltage can be calculated by analyzing individual offsets of matched devices used in the memory cell sense circuit and reflecting the voltage offset back to first bit line 17 and second bit line 18. Using a statistical model of the individual voltage offsets and their correlation to one another will generate a worst case voltage offset across first bit line 17 and second bit line 18. The worst case voltage offset could generate a false output condition during a memory cell sense cycle when an enabled memory cell is in a second logic state.

The worst case voltage offset can be compensated for by reducing current source circuit 24 current I/2 and reducing current sink circuit 26 current −I/2. In the preferred embodiment, current source circuit 24 and current sink circuit 26 will each have an identical current reduction.

If an enabled memory cell during a memory cell sense cycle is in a first logic state, a current magnitude reduction of current sink circuit 24 and current source circuit 26 will slow the rate at which current sink circuit 24, current source circuit 26, and the enabled memory cell combine to generate a differential voltage across first bit line 17 and second bit line 18.

If an enabled memory cell during a memory cell sense cycle is in a second logic state, a current magnitude reduction of current sink circuit 24 and current source circuit 26 can be made to counteract the worst case voltage offset which could generate the false output condition. Memory cell 11 in a memory cell second logic state will sink a current $-I$ into first output 12 as indicated by arrow 21. Reducing current source circuit 24 current from I/2 to (I/2−dI) will combine with memory cell 11 to generate a current $(-I+(I/2-dI))=(-I/2-dI)$ which discharges first bit line 17 at an increased rate. Second output 13 does not source or sink any current when memory cell 11 is in the second logic state. Reducing current magnitude of current sink circuit 24 from $-I/2$ to $(-I/2+dI)$ will combine with memory cell 11 to generate a current $(0+-I/2+dI)=-(-I/2+dI)$ which discharges second bit line 18 at a decreased rate. A differential voltage is created which causes sense amplifier 31 and output level translators 33 and 34 to generate a memory cell second logic state. The current dI should be made large enough to counter a worst case offset voltage which would cause sense amplifier 31 and output level translators 33 and 34 to generate a memory cell first logic state.

By now it should be appreciated that there has been provided a memory cell sense technique. The memory cell sense technique utilizes output level translators which can be preset to a memory cell second logic state, a current source circuit, and a current sink circuit. The current sink circuit and current source circuit increase sensing speed when a memory cell is in a memory cell first logic state. The current sink circuit and current source circuit do not affect the output level translators preset memory cell second logic state when a memory cell is in a second logic state. This results in an increase in memory cell sense speeds.

We claim:

1. A circuit for sensing a logic state of a memory cell, the memory cell having a first output coupled to a first bit line and a second output coupled to a second bit line, the memory cell receiving a memory cell control signal for enabling or disabling the first and second outputs thereof, and the first and second bit lines being precharged to a predetermined voltage prior to a memory cell sense cycle, the circuit comprising:
   means for sinking a predetermined current from the first bit line during the memory cell sense cycle, said means for sinking a predetermined current being independent from the memory cell;
   means for sourcing a predetermined current to the second bit line during the memory cell sense cycle, said means for sourcing a predetermined current being independent from the memory cell;
   a differential sense amplifier for amplifying any voltage difference between the first bit line and the second bit line, said differential sense amplifier having an input coupled to the first bit line, an input coupled to the second bit line, and a first output and second output at which an amplified voltage difference occurs; and
   an output level translator for converting said amplified voltage difference occuring across said first and second outputs of said differential sense amplifier to a logic state corresponding to the logic state stored in the memory cell, said output level translator having an input coupled to said first output of said differential sense amplifier, an input coupled to said second output of said differential sense amplifier, and an output.

2. The circuit as recited in claim 1, wherein said differential sense amplifier being disabled prior to the memory cell sense cycle and enabled during the memory cell sense cycle.

3. The circuit as recited in claim 1, wherein said means for sourcing and said means for sinking a predetermined current are enabled simultaneously during the memory cell sense cycle.

4. The circuit as recited in claim 1, further including a second output level translator for providing a complemented output of the logic state stored in the memory cell, the second output level translator having an input coupled to said first output of said differential sense amplifier, an input coupled to said second output of said differential sense amplifier, and an output.

5. The circuit as recited in claim 4, further including a tri-state buffer including an input coupled to said output of said output level translator, an input coupled to said output of said second output level translator, an input receiving a buffer enable signal, and an output.

6. The circuit as recited in claim 1, wherein the memory cell either sinks current at the first or the second output thereof depending on the memory cell being in a first or second logic state respectively during the memory cell sense cycle, said sink current at either the first or second output being substantially equal and wherein the memory cell does not source an appreciable current at either the first or second outputs.

7. The circuit as recited in claim 6, wherein the means for sinking a predetermined current sinks a current having a magnitude equal to or less than one half the magnitude of said sink current provided at either the first or the second output of the memory cell.

8. The circuit as recited in claim 6, wherein the means for sourcing a predetermined current sources a current having a magnitude equal to or less than one half the magnitude of said sink current provided at either the first or the second output of the memory cell.

9. A method for sensing a memory cell logic state during a memory cell sense cycle, the memory cell having a first output coupled to a first bit line and a second output coupled to a second bit line, the method comprising:
   precharging the first bit line and the second bit line to substantially equal voltages prior to starting the memory cell sense cycle;
   enabling the first and second outputs of the memory cell thereby coupling the memory cell to the first and second bit lines during the memory cell sense cycle;
   sinking a predetermined current from the first bit line using a current sink circuit during the memory cell sense cycle;
   sourcing a predetermined current to the second bit line using a current source circuit during the memory cell sense cycle;
   generating a voltage difference across the first bit line and the second bit line when the memory cell stores a first logic state, wherein current from the current sink circuit and the memory cell add to create a negative transition on the first bit line and wherein current from the current source circuit and the memory cell add to create a positive voltage transition on the second bit line; and generating a voltage difference across the first bit line and the second bit line when the memory cell stores a second logic state, wherein current from the current sink circuit and the memory cell substract from one another to create a voltage transition on the first bit line and wherein current from the current source circuit and the memory cell subtract from one another to create a voltage transition on the second bit line.

10. The method as recited in claim 9 further including:

synchronizing the memory cell sense cycle by enabling the first and second outputs of the memory cell, the current sink circuit, and the current source circuit simultaneously;

amplifying either the voltage difference across the first and second bit lines when the memory cell stores the first logic state or the voltage difference across the first and second bit lines when the memory cell stores the second logic state, with a sense amplifier, said sense amplifier providing an amplified voltage difference; and converting the amplified voltage difference with an output level translator, said output level translator having an output providing a logic state corresponding to the logic state stored in the memory cell.

11. The method as recited in claim 9 wherein the generating a voltage difference across the first bit line and the second bit line when the memory cell stores a second logic state step includes:

forming the memory cell to provide a sink current at either the first or second output, said sink current at either the first or second outputs being substantially equal;

limiting the current sink circuit to a current magnitude equal to or less than one half said sink current of the memory cell; and limiting the current source circuit to a current magnitude equal to or less than one half said sink current of the memory cell, wherein current from the current sink circuit and the memory cell creates a negative transition on the first bit line, wherein current from the current source circuit and the memory cell creates a negative transition on the second bit line, and wherein said negative transition on the second bit line being equal to or greater than said negative transition the first bit line.

12. The method as recited in claim 10 further including:

converting the amplified voltage difference with a second output level translator, said second output level translator having an output providing a logic state corresponding to a complement of the logic state stored in the memory cell;

providing a tri-state buffer for driving capacitive loads, said tri-state buffer having an input coupled to said output of said output level translator and an input coupled to said output of said second output level translator.

13. The method as recited in claim 12 further including:

presetting the output of the output level translator to the second logic state prior to the memory cell sense cycle;

presetting the output of the second output level translator to the first logic state prior to the memory cell sense cycle.

14. A method for sensing a logic state stored in a memory cell during a memory cell sense cycle, the memory cell having a first output coupled to a first bit line and a second output coupled to a second bit line, the memory cell having an input for enabling the first and second outputs for coupling respectively to the first and second bit lines, a sink current is provided at either the first or second output, and the memory cell does not source an appreciable current at either the first or second outputs, the method comprising:

providing a means for converting a voltage difference across the first and second bit lines to a logic state corresponding to the logic state stored in the memory cell, said means for converting a voltage difference including an output for providing said logic state;

presetting said output of said means for converting a voltage difference to a second logic state prior to the memory cell sense cycle;

precharging the first and second bit lines to a substantially equal voltage prior to the memory cell sense cycle;

enabling the memory cell such that the first and second outputs of the memory cell to couple respectively to the first and second bit lines to start the memory cell sense cycle;

enabling a current sink circuit coupled to the first bit line;

enabling a current source circuit coupled to the second bit line;

generating a voltage difference across the first and second bit lines when the memory cell stores a logic signal corresponding to a first logic state, current from the memory cell and said current sink circuit add to create a negative voltage transition on the first bit line, current from said current source circuit creates a positive voltage transition on the second bit line, said output of said means for converting a voltage difference changing from said second logic state to the first logic state corresponding to said first logic state stored in the memory cell; and generating a voltage difference across the first and second bit lines when the memory cell stores a logic signal corresponding to said second logic state, current from the current sink circuit creates a negative transition on the first bit line, current from the current source circuit and the memory cell subtract from one another to create a negative voltage transition on the second bit line, said output of said means for converting a voltage difference remains in the second logic state corresponding to said second logic state stored in the memory cell.

15. The method as recited in claim 14 further including:

enabling the current sink circuit, the current source circuit, and the first and second outputs of the memory cell at a substantially similar time.

16. The method as recited in claim 15 further including:

forming the memory cell to provide substantially equal sink currents at the first and second outputs of the memory cell;

limiting current from the current sink circuit to a magnitude of one half or less the sink current of the memory cell; and limiting current from the current source circuit to a magnitude of one half or less the sink current of the memory cell, wherein said negative voltage transition on the second bit line being greater than or equal to said negative voltage transition on the first bit line when the memory cell stores the logic signal corresponding to said second logic state.

17. The method as recited in claim 16 further including:
providing currents having substantially equal current magnitudes from the current source circuit and the current sink circuit.

18. A method for sensing an output from a memory cell comprising:
presetting an output level translator to a second logic state prior to a read cycle;
precharging bit lines coupled to the memory cell prior to the read cycle to substantially identical voltages;
using a current source circuit and a current sink circuit to simultaneously discharge both bit lines at an identical rate when the second logic state is read from the memory cell; and
using the current source circuit and the current sink circuit to cause a differential voltage to be created across the bit lines when a first logic state is read from the memory cell.

19. The method for sensing an output from a memory cell of claim 18 further including:
providing the current sink circuit and the current source circuit to have identical current magnitudes;
defining the identical current magnitudes of the current sink circuit and the current source circuit as a ratio of the memory cell sink current magnitude; and
tracking the ratio of the memory cell sink current magnitude to the identical current magnitudes over temperature and voltage conditions.

20. The method, for sensing an output from a memory cell of claim 19 further including:
limiting the identical current magnitudes of the current source circuit and the current sink circuit to a current magnitude equal to or less than one half of the memory cell sink current magnitude.

* * * * *